United States Patent [19]

Iacono et al.

[11] 4,068,916

[45] Jan. 17, 1978

[54] VOLTAGE TAP

[75] Inventors: Frederick Della Iacono, Crestwood; Allen Trustman, Ossining; Donald J. LeVine, Tarrytown, all of N.Y.

[73] Assignee: Kings Electronics Company, Inc., Tuckahoe, N.Y.

[21] Appl. No.: 769,876

[22] Filed: Feb. 18, 1977

[51] Int. Cl.² ............................................. H01R 17/18
[52] U.S. Cl. .......................... 339/177 R; 339/154 A; 339/159 R
[58] Field of Search ........... 339/154 R, 154 A, 157 R, 339/159 R, 177 R, 177 E

[56] References Cited

U.S. PATENT DOCUMENTS

| 3,219,963 | 11/1965 | O'Keefe | 339/177 R |
| 3,275,737 | 9/1966 | Caller | 339/177 R |

Primary Examiner—Mark S. Bicks
Attorney, Agent, or Firm—Bierman & Bierman

[57] ABSTRACT

A voltage tap intended as a low-cost broad-band device is made by interconnecting the center conductors of two coaxial lines by a metal plate, and connecting the center conductor of a probe to a second plate lying parallel to and in close proximity to the first plate.

4 Claims, 3 Drawing Figures

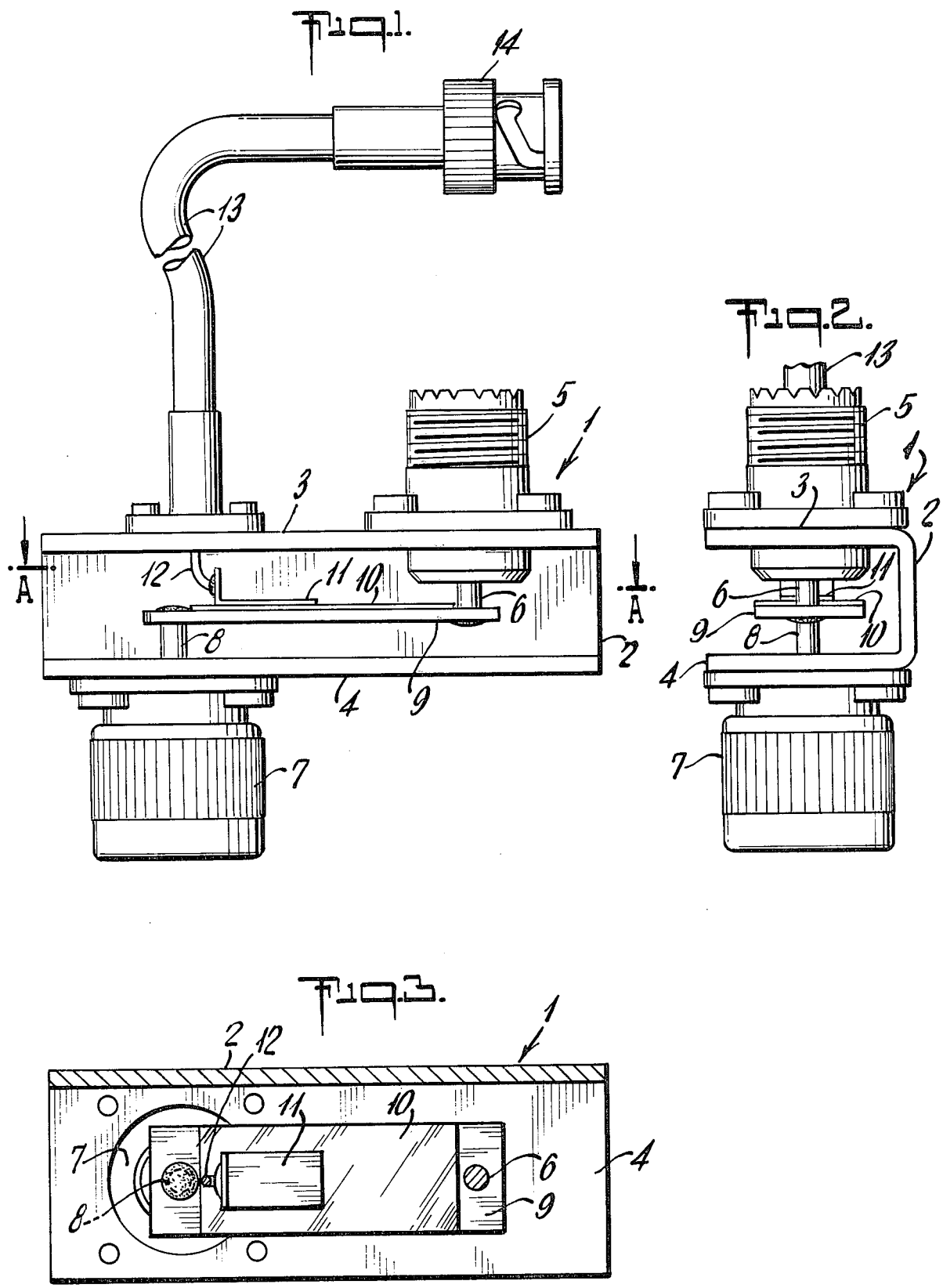

VOLTAGE TAP

Devices for tapping-off power from a high frequency coaxial line for purposes of testing, measuring, monitoring, etc., are already known in the art. In general, such devices have been relatively expensive and involve close manufacturing tolerances. According to the present invention, there is provided a simple coupling device which may be in the form of a self-contained unit or form part of the chassis of a piece of radio or microwave equipment, in which coupling to a transmission line is simply effected and can be made to conform to different frequency bands and different power outputs without deleterious reflections, and at relatively low cost.

Accordingly, it is an object of this invention to provide a low-cost, reflection-free voltage tap coupled to a coaxial line via a short length of transmission line loosely coupled to the main line.

The invention is illustrated in the accompanying drawings in which:

FIG. 1 is a vertical view of the coupling device;

FIG. 2 is an end view thereof; and

FIG. 3 is a plan view taken along the line A—A of FIG. 1.

The frame of device 1 may consist of a back plate 2 with forwardly extending upper and lower plates 3 and 4 respectively, the ends of the device preferably being open.

As more specifically shown in FIGS. 1 and 2, a female coaxial connector 5 is attached in any suitable manner to the upper plate 3, with a center conductor extension 6 projecting downwardly to approximately the center of the device. At the opposite end of the device 1 is mounted a male coaxial connector 7 provided with a center conductor extension 8 reaching upwardly to approximately the center of the device.

The two center conductor extensions 6 and 8 are electrically connected to a metallic plate 9, whereby, for example, a complete coaxial through-connection is made between the two connectors 5 and 7. As best seen in FIG. 3, a portion of the upper surface of plate 9 is covered by an insulating layer 10 above which is attached a smaller plate 11, preferably having an upwardly extending portion 12 electrically connected to the center conductor of a coaxial probe cable 13. The latter may be provided with a coaxial connector 14 for attachment to any appropriate measuring, monitoring or display device.

The structure above-described provides a transmission line, loosely coupled to the main coaxial line so that measurements, i.e., voltage can be obtained without unwanted reflections. By varying the thickness of the insulating layer 10 and the size of plate 11, a low-cost broad-band voltage tap useful over a wide range of powers and frequencies is obtainable.

The type of insulation 10 may be chosen from many suitable and known in the art. The insulation may be bonded to and between the two plates, or attached in any other suitable manner, as by wrapping. On the other hand, the insulating layer may, if desired, be fully dispensed with, the plates 9 and 11 in such case being merely mechanically supported and spaced from one another at a distance to provide the proper coupling.

In most instances, the device 1 is attached to or may be included as part of the chassis of the equipment with which it is to be used. On the other hand, it is within the scope of this invention to make the voltage tap as a unitary device, in which event it may be totally enclosed, either structurally or by being imbedded in a suitable epoxy resin.

While the invention has been described in detail with respect to certain preferred examples and embodiments, it will be understood by those skilled in the art that various changes and modifications may be made without departing from the spirit and scope of the invention.

What is claimed as new is:

1. Voltage tap to a coaxial line, comprising a first coaxial line having an extended center conductor, a second coaxial line having an extended center conductor, a first metal plate electrically interconnecting said extended center conductors, a second metal plate mounted parallel to and in close proximity to said first metal plate, a third coaxial line, means electrically connecting the center conductor of said third coaxial line to said second metal plate and means electrically interconnecting the outer conductors of all said coaxial lines.

2. Voltage tap according to claim 1 in which said last means comprises a metal frame, in combination with means rigidly mechanically supporting all of said coaxial lines on said frame.

3. Voltage tap according to claim 1, in which a sheet of insulation is attached to said first plate, and said second plate is mounted on said sheet of insulation.

4. Voltage tap according to claim 2 in combination with input and output connectors mounted on said metal frame, respectively forming part of said first and second coaxial lines, and in which said extended center conductors are respectively part of said input and output connectors.

* * * * *